(12) United States Patent
Uchiyama et al.

(10) Patent No.: US 8,076,740 B2
(45) Date of Patent: Dec. 13, 2011

(54) PHOTO DETECTOR WITH A QUANTUM DOT LAYER

(75) Inventors: Yasuhito Uchiyama, Kawasaki (JP);
Hironori Nishino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/452,241

(22) Filed: Jun. 14, 2006

(65) Prior Publication Data
US 2007/0215858 A1 Sep. 20, 2007

(30) Foreign Application Priority Data

Mar. 14, 2006 (JP) ................................. 2006-069232

(51) Int. Cl.
*H01L 27/14* (2006.01)
(52) U.S. Cl. ............... 257/431; 257/9; 257/12; 257/184; 257/414; 257/428; 257/E29.071; 257/E29.076; 257/E29.168; 257/E49.003
(58) Field of Classification Search ........... 257/E29.071, 257/E29.076, E29.168, E49.003, 9, 12, 184, 257/414, 428, 431
See application file for complete search history.

(56) References Cited

U.S. PATENT DOCUMENTS

| 5,124,770 | A * | 6/1992 | Umemoto et al. ............ 257/192 |
| 2005/0017176 | A1 * | 1/2005 | Koch et al. ................. 250/338.4 |
| 2005/0211873 | A1 * | 9/2005 | Krishna et al. ............... 250/206 |
| 2005/0211996 | A1 * | 9/2005 | Krishna et al. ................ 257/85 |
| 2006/0118983 | A1 * | 6/2006 | Cochran et al. .............. 264/40.6 |
| 2006/0222028 | A1 * | 10/2006 | Hatori et al. ............... 372/45.01 |

OTHER PUBLICATIONS

E.-T. Kim, et al; "Tailoring detection bands of InAs quantum-dot infrared photodetectors using $In_xGa_{1-x}As$ strain-relieving quantum wells;" *Applied Physics Letters*; vol. 79; No. 20; Nov. 12, 2001; pp. 3341-3342./Discussed in the specification.
E.-T. Kim, et al; "High detectivity InAs quantum dot infrared photodetectors;" *Applied Physics Letters*; vol. 84; No. 17; Apr. 26, 2004; pp. 3277-3279./Discussed in the specification.
"Japanese Office Action", Mailed Aug. 25, 2009 from JP Patent Office for corresponding JP App. No. 2006-069232.
Chou, Shu-Ting "Quantum-Dot Infrared Photodetectors With p-Type-Doped GaAs Barrier Layers",*IEEE Photonics Technology Letters*, vol. 17, No. 11 Nov. 2005, 2409-2411.
JPO Office Action mailed Dec. 15, 2009 in corresponding JP Patent Application No. 2006-069232, Full English translation.
Debdas Pal et al., "Uniformly doped InAs/GaAs quantum-dot infrared photodetectors with AlGaAs current block layer," *Proceedings of 2005 5th IEEE Conference on Nanotechnology*, Nagoya, Japan, Jul. 2005 (English language).

* cited by examiner

*Primary Examiner* — Jay C Kim
(74) *Attorney, Agent, or Firm* — Fujitsu Patent Center

(57) ABSTRACT

A photo detector is provided with a plurality of quantum dot layers and first conductive type contact layers provided at both sides of the plurality of quantum dot layers so as to sandwich them; a second conductive type impurity is doped in a first semiconductor layer formed between one first conductive type contact layer and a first quantum dot layer which is closest to the one first conductive type contact layer so that it results in a barrier against a carrier positioned at the one first conductive contact layer.

10 Claims, 6 Drawing Sheets

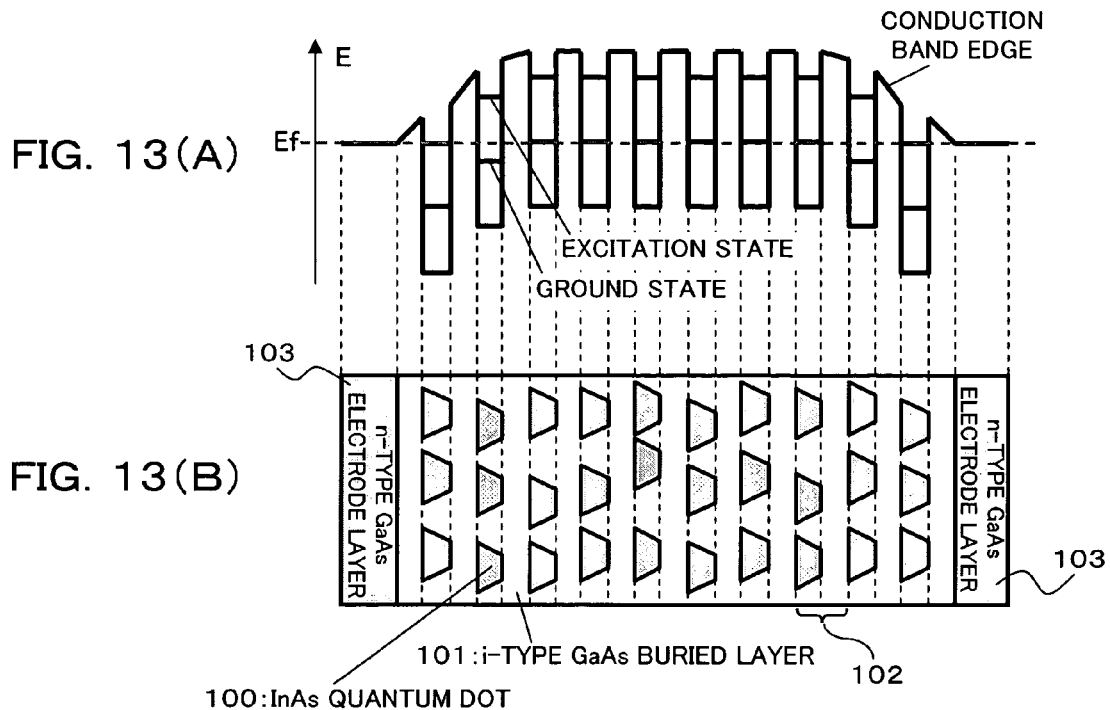
FIG. 14
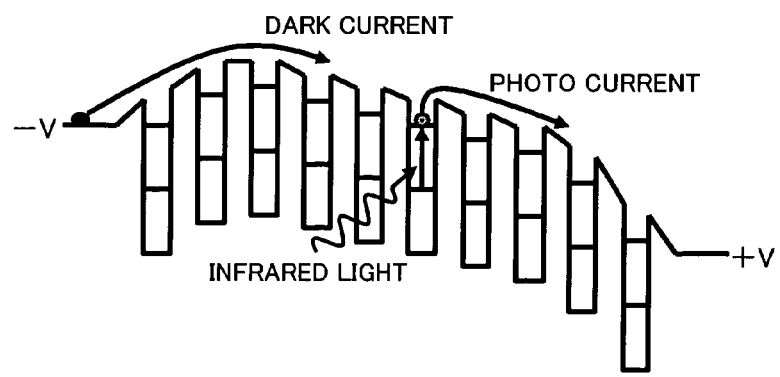

PHOTO DETECTOR WITH A QUANTUM DOT LAYER

CROSS REFERENCE TO RELATED APPLICATIONS

This application is based on and hereby claims priority of Japanese Application No. 2006-069232 filed on Mar. 14, 2006 in Japan, the contents of which are hereby incorporated by reference.

BACKGROUND OF THE INVENTION (1) Field of the invention

The present invention relates to a photo detector, for example, which is appropriately used as a quantum dot infrared photo detector.

(2) Description of the Related Art

Conventionally, a quantum dot infrared photo detector (QDIP), for example as shown in FIG. 13(B), has a structure in which a quantum dot layer 102 buries InAs quantum dots 100 with an i-type GaAs buried layer 101; a plurality of the quantum dot layers 102 multilayered (stacked) repeatedly are sandwiched between n-GaAs contact layers (electrode layers) 103.

Since the InAs quantum dots 100 are formed through the self-forming method in a molecular beam epitaxial apparatus, they are distributed within a perpendicular plane to the growth direction. Commonly, in order to enhance the infrared detecting efficiency, as a device in which a plurality layers (e.g., tenth layers) of quantum dot layers 102 each of which includes the InAs quantum dots 100 distributed within this plane are multilayered is used.

FIG. 13(A) shows a conduction band edge profile in a quantum dot infrared detector having such structure. The shape of the conduction band edge profile can be described below.

Since no impurity is doped in the region of the multilayered quantum dot layers 102, electrons are supplied from the n-type GaAs contact layer 103.

Since the ground state (the ground level) of the InAs quantum dots 100 is lower than the energy level of the conduction band edge of the i-type GaAs buried layer 101, the electrons supplied from the n-type GaAs contact layer 103 are positioned at the ground state of the InAs quantum dots 100.

When a probability that an electron occupies a certain energy level becomes ½, it is defined that Fermi level $E_f$ is equal to the energy level of the electron. Here, the Fermi level $E_f$ has become equal to the ground state of the InAs quantum dots 100.

When a system is in a thermal balance state, the Fermi level $E_f$ becomes constant in all of the system.

Accordingly, the conduction band edge profile, as shown in FIG. 13(A), results in a shape that the conduction band edge of portions in which the quantum dot layers 102 are multilayered (stacked) is mounded such that the energy level of the conduction band edge which is equal to the Fermi level of the n-type GaAs contact layer 103 and the ground state of the InAs quantum dots 100 may generally become a constant energy level.

However, since, in the quantum dot layers 102 near the n-type GaAs contact layer 103, the electrons from the n-type GaAs contact layer 103 are excessively supplied, the Fermi level reaches the excited state (excited level) of the InAs quantum dots 100, the mound of the conduction band edge becomes small.

Such quantum dot infrared detector is used in a state that a potential difference is applied between the n-type GaAs contact layers 103.

Here, FIG. 14 shows a conduction band edge profile in such a case that a potential difference is applied between the n-type GaAs contact layers 103 with such a structure. In addition here, it is assumed that the electric field is evenly added to the region in which the quantum dot layers 102 are multilayered.

In this quantum dot infrared detector, as shown in FIG. 14, when infrared lights are made incident from outside, the electrons which are positioned at the ground state within the InAs quantum dots 100 buried in the i-type GaAs buried layer 101 are excited to the excited state by the incident infrared lights. Since the potential difference is applied between the n-type GaAs contact layers 103, the excited electrons flow between the n-type GaAs contact layers 103, and become current (referred to as photo electric current or photo current, hereafter). With detecting this photo current, infrared lights can be detected.

In addition, the prior art documents related to the quantum dot infrared detector are as follows: for example, (1) Eui-Tae Kim et al. "Tailoring detection bands of InAs quantum-dot infrared photo detectors using InxGa1-xAs strain-relieving quantum wells", APPLIED PHYSICS LETTERS, VOLUME 79, NUMBER 20, pp. 3341 to 3343, 12 Nov. 2001; and (2) Eui-Tae Kim et al. "High detectivity InAs quantum-dot infrared photo detectors", APPLIED PHYSICS LETTERS, VOLUME 84, NUMBER 17, pp. 3277 to 3279, 26 Apr. 2004.

However, in the quantum dot infrared detectors described above, as shown in FIG. 14, even though when no infrared light is made incident, the electrons which are positioned at the n-type GaAs contact layer 103 of low potential caused by the potential difference added between the n-type GaAs contact layers 103 flow between the contact layers and become the dark current.

In other words, in the quantum dot infrared detectors described above, as shown in FIG. 14, in the state that the potential difference is applied, although the energy level of the conduction band edge of the i-type GaAs buried layer 101 which is a few layers distance from the n-type GaAs contact layer 103 of low potential becomes the highest; however, the electrons flowing out from the n-type GaAs contact layer 103 of low potential become dark current that exceed the energy level.

By the way, since the performance of infrared detector is generally determined by a ratio of dark current to photo current, it is important for the performance of the infrared detector to reduce dark current to improve its performance.

In order to reduce dark current, it is conceivable to make the energy level of the conduction band edge of the i-type GaAs buried layer 101 that is a few layers distance from the n-type GaAs contact layer 103 of low potential high.

For example, it is conceivable to make the energy level of the conduction band edge of the buried layer high, by using the AlGaAs having the larger band gap than the i-type GaAs as the material of the buried layer instead of the i-type GaAs.

However, when causing the InAs quantum dot layers 100 to grow, the element temperature is required to rise about 500° C. Even if the AlGaAs layers which are normally grown with about 600° C. element temperature are grown near the quantum dots, it is difficult for the AlGaAs layers to cause it to grow in optimizing the growth condition.

SUMMARY OF THE INVENTION

One aspect of the present invention is to provide a photo detector which can easily reduce dark current and improve performance of the detector.

A photo detector (a quantum dot infrared detector) according to one aspect of the present invention is provided with a plurality of quantum dot layers including quantum dots, and first conductive type contact layers which are so provided that the first conductive type contact layers sandwich the plurality of quantum dot layers at the both sides thereof. A second conductive type impurity is doped in a first semiconductor layer formed between the one of the first conductive type contact layers and a first quantum dot layer which is the closest to the one of the first conductive type contact layers so as to form barrier against carriers positioned in the one of the first conductive type contact layers.

Therefore, the photo detector according to one apect of the present invention has advantages that it is possible to reduce dark current easily and improve performance of the detector.

BRIEF DESCRIPTION OF THE DRAWINGS

FIG. 13(A) is a diagram showing a conduction band edge profile of a conventional quantum dot infrared detector;

FIG. 13(B) is a schematic cross-sectional view showing a structure of a conventional quantum dot infrared detector; and FIG. 14 is a diagram showing a conduction band edge profile of the conventional quantum dot infrared detector with being applied a potential difference.

DESCRIPTION OF THE PREFERRED EMBODIMENTS

A photo detector according to embodiments of the present invention will be described with reference to the accompanying drawings below.

First Embodiment

First, a photo detector according to a first embodiment of the present invention will be described referring to FIGS. 1 to 6.

Hereinafter, the embodiment will be described taking a case wherein the present invention is applied to a quantum dot infrared detector which is capable of generating photo current depending on incident amount of infrared lights, using quantum dots as infrared absorption portion, as an example.

Figure 1:
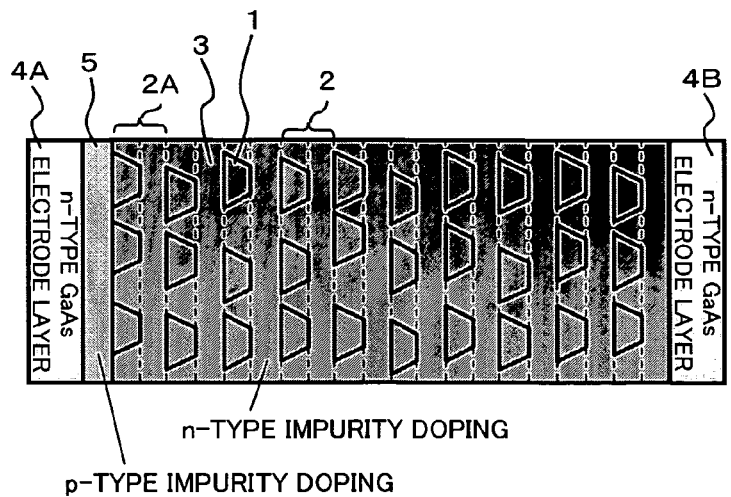
FIG. 1 is a schematic cross-sectional view showing a configuration of a photo detector (quantum dot infrared detector) according to a first embodiment of the present invention.

The quantum dot infrared detector according to the present embodiment, for example as shown in FIG. 1, is provided with a plurality of quantum dot layers 2 including InAs quantum dots 1 and n-type GaAs contact layers (first conductive type contact layers; electrode layers) 4A, 4B provided at the opposite sides so as to sandwich the plurality of quantum dot layers 2 therebetween.

In this case, the quantum dot layer 2 is configured by burying the InAs quantum dots 1 with GaAs buried layer 3. By the way, the quantum dot layer 2 is not limited to that describe above, it may be configured by forming a GaAs intermediate layer on an InGaAs cap layer or an InAlAs cap layer which covers the InAs quantum dots 1, for example. Thereby, it is possible to achieve rendering response wavelength of the quantum dot infrared detector long or short.

Then, in this embodiment, as shown in FIG. 1, p-type impurity (second conductive type impurity) is doped in a GaAs layer (a first semiconductor layer) 5 formed in a region between one n-type GaAs contact layer 4A (here, a n-type GaAs contact layer becoming low potential when a potential difference (bias) is applied) and a quantum dot layer (a first quantum dot layer) 2A which is the closest to this n-type GaAs contact layer 4A of low potential.

Thus, the barrier against the electrons (carriers) positioned at the n-type GaAs contact layer 4A of low potential is formed between the n-type GaAs contact layer 4A and the first quantum dot layer 2A upon doping the p-type impurity therein without changing the material and composition of the buried layer burying the quantum dots 1, so that the dark current can be reduced.

Figure 2:
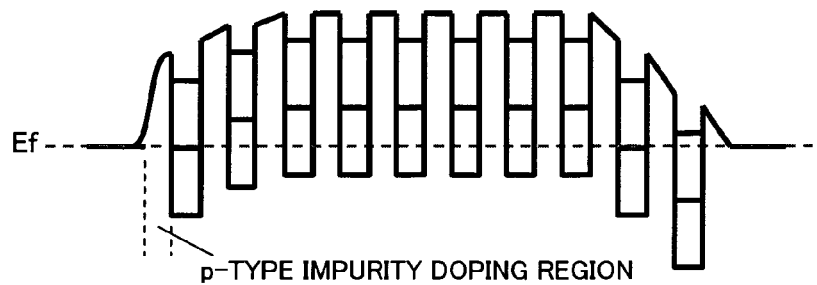
FIG. 2 is a diagram showing a conduction band edge profile of a photo detector (quantum dot infrared detector) with being doped p-type impurity according to the first embodiment of the present invention.

Here, FIG. 2 shows a conduction band edge profile in case that the p-type impurity is doped in the GaAs layer 5.

As shown in FIG. 2, when the p-type impurity is doped in the GaAs layer 5 formed between the n-type GaAs contact layer 4A and the first quantum dot layer 2A which is the closest to this n-type GaAs contact layer 4A, an energy level of the conduction band edge of the GaAs layer 5 doped the p-type impurity more increases than that when no p-type impurity is doped (the case of the i-n junction; refer to FIG. 13(A)), because of the principle of the p-n junction.

In other words, as shown in FIG. 2, the p-type impurity is doped in the GaAs layer 5 being the closest to the n-type GaAs contact layer 4A thereby the energy level of the conduction band edge of the GaAs layer 5 being the closest to the contact layer 4A of low potential can be increased to the same degree level to an energy level of the conduction band edge of an i-type GaAs buried layer which is a few layers distance from the contact layer of low potential of the conventional structure (refer to FIGS. 13(A), 14).

When no p-type impurity is doped in the GaAs layer 5, in the first quantum dot layer 2A being the closest to the n-type GaAs contact layer 4A, the Fermi level reaches the excited state of the quantum dots 1 (refer to FIG. 13(A)); when the p-type impurity is doped in the GaAs layer 5, as shown in FIG. 2, it decreases to the ground state of the quantum dots 1.

On the other hand, as shown in FIG. 2, in a quantum dot layer 2 formed between the GaAs layer (the first semiconductor layer) 5 and the other n-type GaAs contact layer 4B, the conduction band edge more increases than that when no p-type impurity is doped (refer to FIG. 13(A)), corresponding to increasing the energy level of the conduction band of the GaAs layer 5 doped the p-type impurity.

Then, as shown in FIG. 2, since the Fermi level of a region between the GaAs layer (the first semiconductor layer) 5 and the other n-type GaAs contact layer 4B relatively decreases (that is, the Fermi level relatively more decreases than the ground state of the quantum dots 1), the electrons within the quantum dots 1 diffuse toward the n-type GaAs contact layers 4A, 4B, thereby the number of the electrons positioned at the ground state of the quantum dots 1 decrease. Since the electrons positioned at the ground state of the quantum dots 1 are excited when infrared lights are made incident, so the electrons result in sources of photo current; decreasing the number of the electrons causes the amount of the photo current to reduce.

For that reason, in this embodiment as shown in FIG. 1, the n-type impurity (the first conductive type impurity) is doped in the region (here, the quantum dots 1 formed in this region) between the GaAs layer (the first semiconductor layer) 5 and the other n-type GaAs contact layer 4B (here, n-type GaAs contact layer which becomes high potential when the potential difference is applied).

Figure 3:
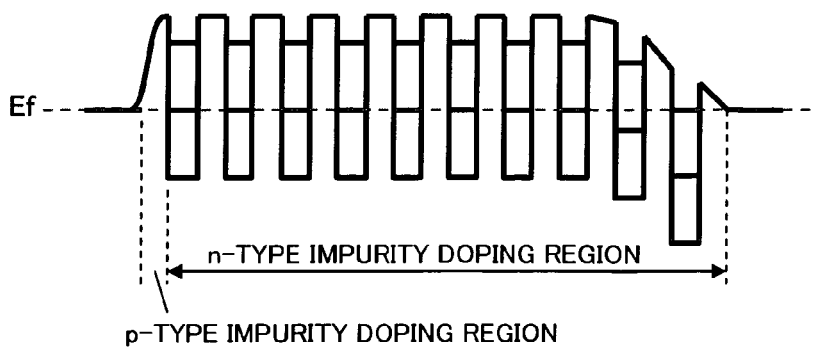
FIG. 3 is a diagram showing a conduction band edge profile of a photo detector (quantum dot infrared detector) with being doped p-type impurity and n-type impurity according to the first embodiment of the present invention.

In this case, when approximately making the number of the impurity equal to those of the quantum dots, one electron is generally applied to the ground state of the quantum dots 1, as shown in FIG. 3, the Fermi level becomes equal to the ground state of the quantum dots 1. Thereby, it is possible to prevent the number of the electrons which are positioned at the ground state of the quantum dots 1 from decreasing, so that it is possible to prevent decreasing of the amount of the photo current.

By the way, if it is possible to prevent decreasing of the amount of the photo current through alternative techniques, it is not necessary to dope the n-type impurity in the region between the first semiconductor layer 5 and the other n-type GaAs contact layer 4B.

Now, as the conventional manner, when no p-type impurity is doped, the energy level of the conduction band edge of the i-GaAs buried layer which is a few layers distance from the contact layer of low potential becomes highest with the state in which the potential difference is applied; the electrons flowing out from the contact layer of low potential go beyond this energy level and become the dark current (refer to FIG. 14).

Figure 4:
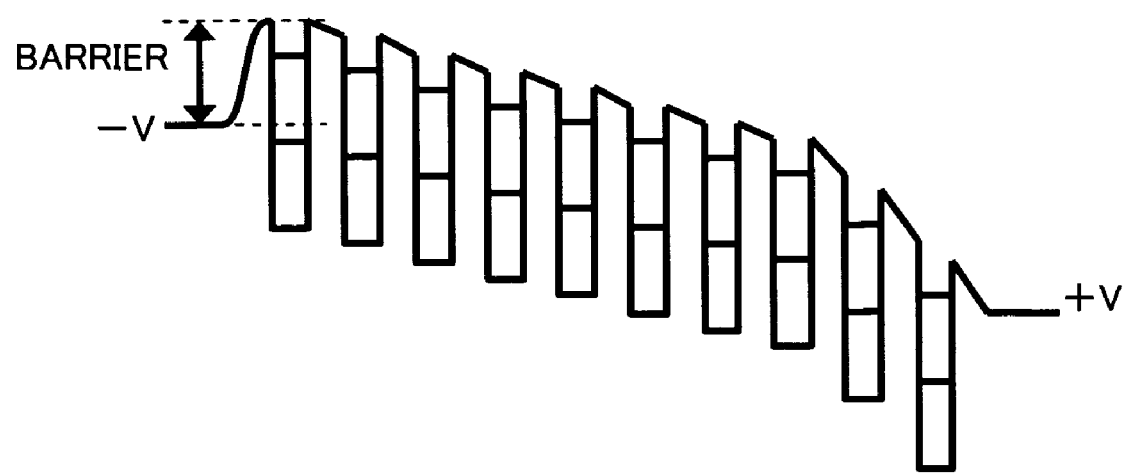
FIG. 4 is a diagram showing a conduction band edge profile of a photo detector (quantum dot infrared detector) with being applied a potential difference according to the first embodiment of the present invention.

Here, FIG. 4 shows a conduction band edge profile in the case that the potential difference is applied between n-type GaAs contact layers 4A and 4B.

As described above, when the p-type impurity is doped in the GaAs layer 5 formed between the one n-type GaAs contact layer 4A and the first quantum dot layer 2A which is the closest to this contact layer 4A, as shown in FIG. 4, when the potential difference is applied, the energy level of the conduction band edge of the GaAs layer 5 which is the closest to the n-type GaAs contact layer 4A of low potential becomes highest, this energy level becomes a barrier against the electrons (carriers) positioned at the n-type GaAs contact layer 4A at the low potential.

That is, with doping the p-type impurity in the GaAs layer 5 being the closest to the n-type GaAs contact layer 4A, in a state that the potential difference is not applied, the energy level of the conduction band edge of the GaAs layer 5 being the closest to the n-type GaAs contact layer 4A can be increased to the same degree level to the energy level of the conduction band edge of the i-type GaAs buried layer which is a few layers distance from the contact layer of low potential of the conventional structure. When the potential difference is applied to this, the energy level of the conduction band edge of the GaAs layer 5 which is the closest to the n-type GaAs contact layer 4A of low potential becomes highest; this energy level results in the barrier.

This barrier is more spatially approached toward the n-type GaAs contact layer 4A of low potential than the highest portion of the energy level of the conventional configuration without doping the p-type impurity. Consequently, the height of the barrier becomes higher than the highest portion of the energy level of the conventional configuration. Thereby, it becomes possible to reduce the dark current without changing the material and composition of the GaAs buried layer.

In addition, if the p-type impurity doping and the n-type impurity doping are performed through the molecular beam epitaxial methods for example; it can be performed through an easy techniques such as shutter opening-closing of Be cell used for the p-type impurity or shutter opening-closing of Si cell used for the n-type impurity.

Next, an example of method for fabricating the photo detector (quantum dot infrared detector) according to the present embodiment will be described referring to FIGS. 5 and 6.

By the way, each crystal layer configuring the quantum dot infrared detector, for example, is formed by the crystal growth through the molecular beam epitaxy (MBE) techniques.

Figure 5:
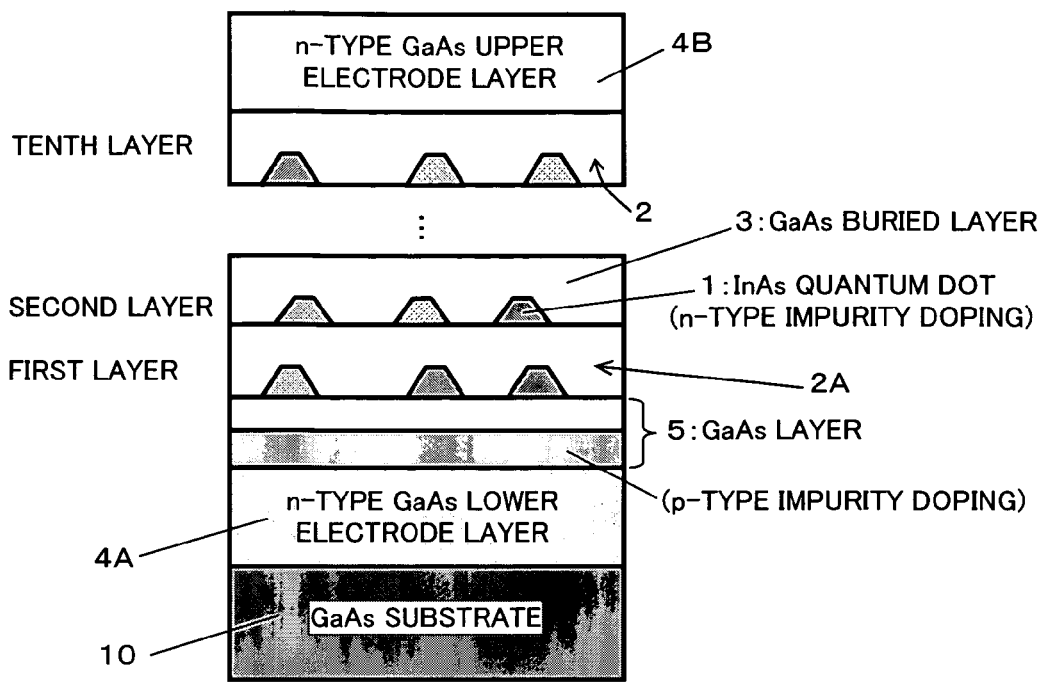
FIG. 5 is a schematic cross-sectional view for illustrating a method for fabrication of a photo detector (quantum dot infrared detector) according to the first embodiment of the present invention.

First, as shown in FIG. 5, it causes the n-type GaAs layer (the first conductive type contact layer) 4A to grow on a GaAs substrate 10, which the n-type GaAs layer becomes a lower contact layer (lower electrode layer) at substrate temperature of 600° C. Its thickness is to be 1000 nm. Si is used as the n-type impurity, its concentration is to be $2 \times 10^{18}/cm^3$ for example.

Subsequently, it causes the GaAs layer (a first semiconductor layer) 5 to grow on the n-type GaAs lower contact layer 4A. Its thickness is to be 50 nm. In addition, while growing this GaAs layer 5, the substrate temperature is changed from 600° C. to 500° C. for example.

In the present embodiment, when it causes the GaAs layer 5 to grow, Be with concentration of $1 \times 10^{17}/cm^3$ as the p-type impurity (the second conductive type impurity) is doped in a region with thickness of 25 nm. In addition, the p-type impurity doping concentration (thickness×concentration) in the p-type impurity doping region (GaAs layer 5) may be the order of $2.5 \times 10^{10}$ to $2.5 \times 10^{12}/cm^2$.

As a result, the energy level of the conduction band of the GaAs layer 5 increases (refer to FIGS. 2, 3); when the potential difference is applied between the contact layers 4A and 4B, a barrier is formed between the n-type GaAs lower contact layer 4A at the low potential and the quantum dot layer (the first quantum dot layer) 2A which is the closest to this n-type GaAs lower contact layer 4A (refer to FIG. 4). Thereby, it is possible to reduce the dark current.

After that, with keeping the substrate temperature at 500° C., InAs is so applied that the growth rate becomes 0.2 ML/s (atom layer/sec). The compressive strain added to the InAs increases through supplying certain degree of amount, so that the InAs quantum dots 1 are formed because the InAs is grown in 3-dimensions (self forming method).

In the present embodiment, during the period of supplying the InAs, the Si as the n-type impurity is supplied with concentration in which one Si corresponds to one quantum dot for example. The concentration may be the order of 0.1 to 10 for one quantum dot.

Subsequently, with keeping the substrate temperature of 500° C., the i-type GaAs buried layer 3 is made to grow. Its thickness is to be 50 nm for example. Thereby, the InAs quantum dot layer 1 is buried with the i-type GaAs buried layer 3. In addition, the quantum dot layer 2 which is the closest to the n-type GaAs lower contact layer 4A is called a first quantum dot layer 2A.

In addition, here, the quantum dot layer 2 is configured as the layer burying the InAs quantum dot 1 with the GaAs buried layer 3; however, the quantum dot layer 2 is not limited to this, for example, it may be configured as the layer forming a GaAs intermediate layer on an InGaAs cap layer or an InAlAs cap layer which covers the InAs quantum dot 1. Thereby, it is possible to achieve rendering response wavelength of the quantum dot infrared detector long or short.

After that, for example, the quantum dot growth process by supplying the InAs and the i-type GaAs layer growth process described above are repeated nine times, for example, so that the total number of multilayer of the quantum dot layer 2 results in tenth layers. In addition, while the last GaAs buried layer 3 is made to grow, the substrate temperature is raised from 500° C. to 600° C. for example.

In the present embodiment, as described above, by doping the n-type impurity in the quantum dots 1 configuring each quantum dot layer 2, decrement the number of the electrons positioned at the ground state of the quantum dots 1 is prevented, so that reduction of the photo current is prevented.

Subsequently, with the substrate temperature of 600° C., the n-type GaAs layer (the first conductive type contact layer) 4B is made to grow which results in an upper contact layer (upper electrode layer). Its thickness is to be 1000 nm, Si is used as the n-type impurity, and its concentration is to be $2 \times 10^{18}/cm^2$ for example.

In this way, as shown in FIG. 5, the multilayer structure is formed in which the plurality of quantum dot layers 2 are sandwiched by the n-type GaAs contact layers 4A and 4B.

Figure 6:
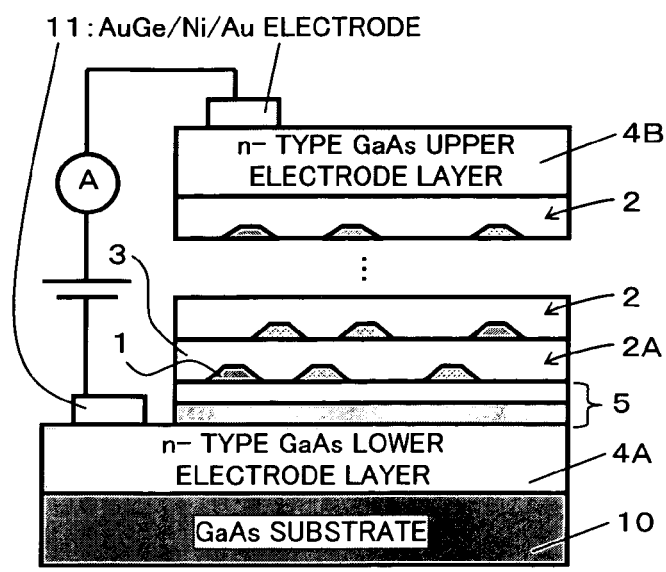
FIG. 6 is a schematic cross-sectional view for illustrating a structure and its method for fabrication of a photo detector (a quantum dot infrared detector) according to the first embodiment of the present invention.

After that, for example, as shown in FIG. 6, by using the photolithography and the dry etching, a part across those from the n-type GaAs upper contact layer 4B to the GaAs layer (the first semiconductor layer) 5 which is the closest to the n-type GaAs lower contact layer 4A is removed, and the n-type GaAs lower contact layer 4A is made to expose. Then, for example, an AuGe/Ni/Au electrode 11 is formed on the n-type GaAs lower contact layer 4A and the n-type GaAs upper contact layer 4B through the metal vapor deposition methods for example. Thereby, the quantum dot infrared detector shown in FIG. 6 is manufactured.

The quantum dot infrared detector with such structure can detect infrared lights, by providing potential difference between the electrodes with the polarity causes the electrode formed on the n-type GaAs lower contact layer 4A to become low potential such that the current flowing through the electrodes can be measured, and by detecting change of the current when infrared lights are made incident.

Additionally, in the present embodiment, the p-type impurity is doped in the GaAs layer (the first semiconductor layer) 5 which is the closest to the n-type GaAs lower contact layer 4A which becomes low potential when the potential difference is applied; however, it is not limited to this, the p-type impurity may be doped in the GaAs buried layer (the first semiconductor layer) which is the closest to the n-type GaAs upper contact layer 4B. In this case, by applying the potential difference between the electrodes with the polarity causes the electrode formed on the n-type GaAs upper contact layer 4B to become low potential, the detector is made to operate.

Further, in the present embodiment, the n-type impurity is doped in the InAs quantum dots 1; however, it is not limited to this, the n-type impurity may be doped in the quantum dot layer 2 formed between the GaAs layer (the first semiconductor layer) 5 which is the closest to the n-type GaAs lower contact layer 4A and the n-type GaAs upper contact layer 4B which becomes high potential when the potential difference is applied. Thereby, it is possible to prevent decrement of the amount of the photo current.

For example, the period of supplying the n-type impurity may be the period of causing the GaAs buried layer 3 after supplying each InAs to grow, or the period from the start time of supplying each InAs to the finish time of causing the last GaAs buried layer 3 to grow (that is, the period from the start time of supplying the InAs of the first layer to the finish time of causing the GaAs buried layer 3 of the tenth layer to grow). In other words, the n-type impurity may be doped in the GaAs buried layer 3, or may be doped in the InAs quantum dots 1 and the GaAs buried layer 3. In addition, if the quantum dot layer 2 is configured with the cap layer and intermediate layer, the n-type impurity may be only doped in the cap layer or intermediate layer.

In this case, the n-type impurity doping concentration becomes a concentration in which the total number of the n-type impurity being doped in the region between the GaAs layer (the first semiconductor layer) 5 doped the p-type impurity and the n-type GaAs upper contact layer 4B is 1-fold for the number of the quantum dots in the region for example. The magnification of the concentration may be the order of 0.1 to 10-fold.

Consequently, the photo detector (quantum dot infrared detector) according to the present embodiment has the advantage that it is possible to easily reduce the dark current with only doping the p-type impurity in the GaAs layer (the first semiconductor layer) 5 which is the closest to the one of the n-type GaAs contact layer 4A, hence to improve the performance of the photo detector.

Second Embodiment

Next, a photo detector according to a second embodiment of the present invention will be described referring to FIG. 7.

In the photo detector according to the present embodiment, a region in which n-type impurity and p-type impurity are doped is different from that of the first embodiment described above.

Figure 7:
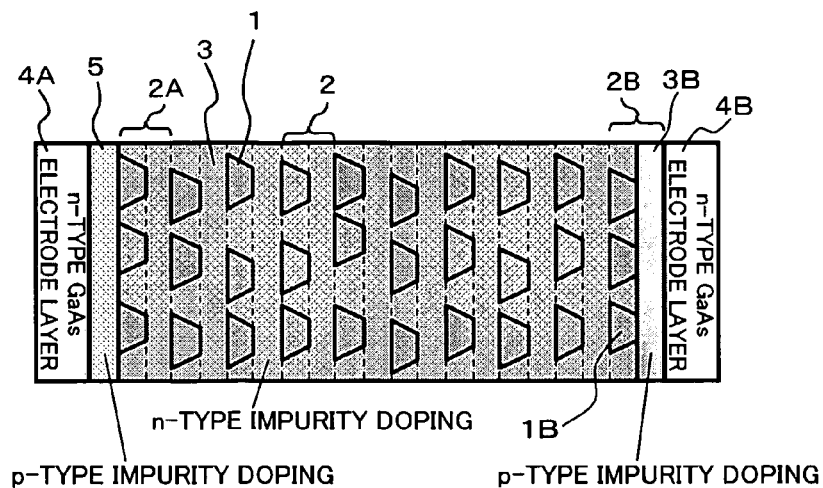
FIG. 7 is a schematic cross-sectional view showing a structure of a photo detector (a quantum dot infrared detector) according to a second embodiment of the present invention.

That is, in the present embodiment, as shown in FIG. 7, p-type impurity (a second conductive type impurity) is doped in a GaAs buried layer (a second semiconductor layer) 3B formed between the other n-type GaAs upper contact layer 4B and a quantum dot 1B configuring a second quantum dot layer 2B which is a closest to the other n-type GaAs upper contact layer 4B, so as to become a barrier against the electrons (carriers) positioned at the other n-type GaAs upper contact layer (the first conductive type contact layer) 4B. In other words, the barrier is formed by doping the impurity; and it is possible to reduce the dark current without changing the material and composition of the buried layer which buries the quantum dots. In addition, in FIG. 7, the same compositions as those of the first embodiment described above (refer to FIG. 1) are attached the same numerals.

Here, the p-type impurity is doped in the GaAs buried layer 3B configuring the second quantum dot layer 2B; however, it is not limited to this. With forming a GaAs layer (a second semiconductor layer) between the other n-type GaAs upper contact layer 4B and the second quantum dot layer 2B which is the closest to the other n-type GaAs upper contact layer 4B, the p-type impurity (the second conductive type impurity) may be doped in this GaAs layer (the second semiconductor layer).

In addition, since other configurations are the same as those of the first embodiment, the different points are mainly described hereinafter.

Figure 8:
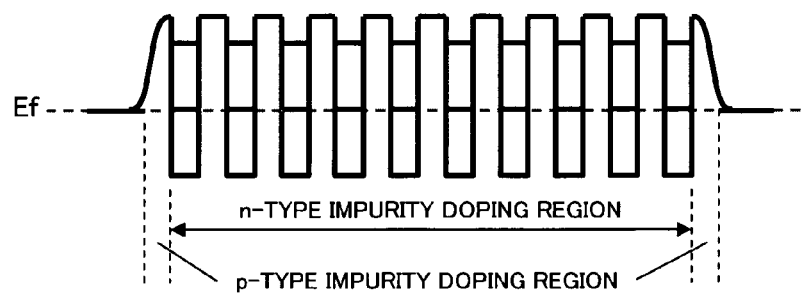
FIG. 8 is a diagram showing a conduction band edge profile of a photo detector (a quantum dot infrared detector) with being doped p-type impurity and n-type impurity according to the second embodiment of the present invention.

Here, FIG. 8 shows a conduction band edge profile in the case of doping the p-type impurity in the GaAs layer 5 and the GaAs buried layer 3B.

As shown in FIG. 8, when the p-type impurity is doped in the GaAs buried layer 3B formed between the other n-type GaAs contact layer 4B and the quantum dots 1B configuring the second quantum dot layer 2B which is the closest to this other n-type GaAs contact layer 4B, the energy level of the conduction band edge of the GaAs buried layer (the second semiconductor layer) 3B doped the p-type impurity more increases than that when no p-type impurity is doped (the case of the i-n junction; refer to FIG. 13(A)), because of the principle of the p-n junction.

Further, when no p-type impurity is doped in the GaAs buried layer 3B, in the second quantum dot layer 2B being the closest to the other n-type GaAs contact layer 4B, the Fermi level reaches to the excited state of the quantum dots 1B (refer to FIG. 13(A)); when the p-type impurity is doped in the GaAs layer 3B, as shown in FIG. 8, it decreases to the ground state of the quantum dots 1B.

Like the first embodiment described above, since the Fermi level of the region between the GaAs buried layer 3B configuring the second quantum dot layer 2B and the GaAs layer 5 relatively decreases (that is, the Fermi level relatively more decreases than the ground state of the quantum dots 1), the electrons within the quantum dots 1, 1B diffuse toward the n-type GaAs contact layers 4A, 4B, hence the number of the electrons positioned at the ground state of the quantum dots 1, 1B decrease. Since the electrons positioned at the ground state of the quantum dots 1, 1B are excited when infrared lights are made incident, and are sources of photo current, decreasing the number of them causes the amount of the photo current to reduce.

For that reason, in this embodiment as shown in FIG. 7, the n-type impurity (the first conductive type impurity) is doped in the region, that is, the quantum dot layers 2, 2B formed in the region, between the GaAs layer (the first semiconductor layer) 5 and the GaAs buried layer (the second semiconductor layer) 3B configuring the second quantum dot layer 2B.

Figure 9A:
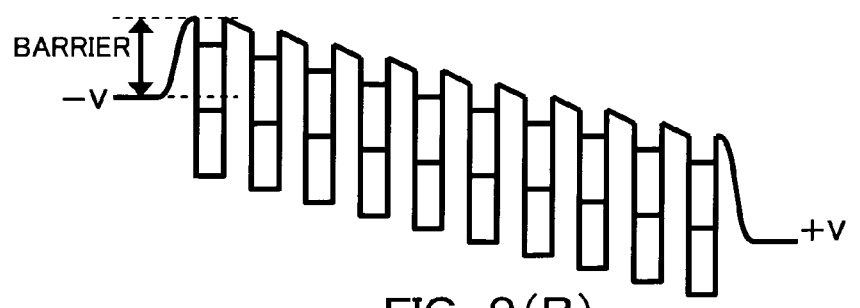
FIG. 9(A) is a diagram showing a conduction band edge profile of a photo detector (quantum dot infrared detector) with being applied a positive potential difference according to the second embodiment of the present invention.
Figure 9B:
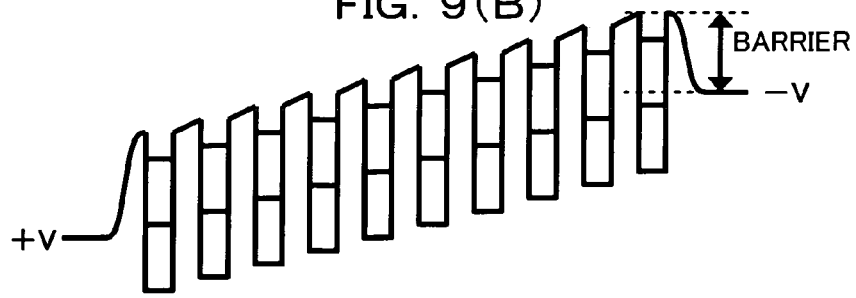
FIG. 9(B) is a diagram showing a conduction band edge profile of a photo detector (quantum dot infrared detector) with being applied a negative potential difference according to the second embodiment of the present invention.

Here, FIGS. 9(A) and 9(B) show conduction band edge profiles when the potential difference is applied between the n-type GaAs contact layers 4A and 4B.

In addition, like the first embodiment described above, FIG. 9(A) is the conduction band edge profile in the case that the potential difference is applied between the electrodes with the polarity (positive polarity) cause the electrode formed on the n-type GaAs lower contact layer 4A to become low potential; FIG. 9(B) is a conduction band edge profile in the case that the potential difference is applied between the electrodes with the reverse polarity, that is, the polarity (negative polarity) cause the electrode formed on the n-type GaAs upper contact layer 4B to become low potential.

When the potential difference of positive polarity is applied between the electrodes, since the p-type impurity is doped in the GaAs layer (the first semiconductor layer) 5 formed between the one n-type GaAs contact layer (lower contact layer) 4A and the first quantum dot layer 2A which is the closest to this n-type GaAs contact layer, as shown in FIG. 9(A), the energy level of the conduction band edge of the GaAs layer (the first semiconductor layer) 5 which is the closest to the n-type GaAs contact layer 4A of low potential becomes highest, it results in the barrier against the electrons positioned at the n-type GaAs contact layer 4A of low potential.

This barrier is more spatially approached toward the n-type GaAs contact layer 4A of low potential than the highest portion of the energy level of the conventional structure in which the p-type impurity is not doped. Consequently, the height of the barrier becomes higher than the highest portion of the energy level of the conventional structure. Thereby, it is possible to reduce the dark current without changing the material and composition of the GaAs buried layer.

In contrast to this, when the potential difference of negative polarity is applied between the electrodes, since the p-type impurity is doped in the GaAs buried layer (the second semiconductor layer) 3B formed between the other n-type GaAs contact layer (upper contact layer) 4B and the quantum dot layer 1B configuring the second quantum dot layer 2B which is the closest to this n-type GaAs contact layer 4B, as shown in FIG. 9(B), the energy level of the conduction band edge of the GaAs buried layer (the second semiconductor layer) 3B which is the closest to the n-type GaAs contact layer 4B of low potential becomes highest, it results in the barrier against the electrons positioned at the n-type GaAs contact layer 4B of low potential.

This barrier is more spatially approached toward the n-type GaAs contact layer 4B of low potential than the highest portion of the energy level of the conventional structure in which the p-type impurity is not doped. Consequently, the height of the barrier becomes higher than the highest portion of the energy level of the conventional structure. Thereby, it is possible to reduce the dark current without changing the material and composition of the GaAs buried layer.

Next, a method for manufacturing the photo detector (quantum dot infrared detector) according to the present embodiment will be described.

In the present embodiment, a process for causing the GaAs buried layer (the second semiconductor layer) 3B which exists immediately below the n-type GaAs upper contact layer (the first conductive type contact layer) 4B to grow, is different from that of the first embodiment.

In other words, when causing the GaAs buried layer (the second semiconductor layer) 3B which exists immediately below the n-type GaAs upper contact layer 4B to grow up to the thickness of 50 nm, Be with concentration of $1\times10^{17}/cm^3$ as the p-type impurity (the second conductive type impurity) is doped in a region with thickness of 25 nm for example. In addition, the p-type impurity doping concentration (thickness×concentration) in the p-type impurity doping region (buried layer 3B) may be the degree of $2.5\times10^{10}$ to $2.5\times10^{12}/cm^2$.

As a result, since the energy level of the conduction band of the GaAs buried layer 3B increases (refer to FIG. 8), when the potential difference is applied between the contact layers 4A and 4B, a barrier is formed between the n-type GaAs upper contact layer 4B at the low potential and the quantum dot layer 1B configuring the quantum dot layer (the first quantum dot layer) 2B which is the closest to this n-type GaAs upper contact layer 4B (refer to FIG. 9(B)) Thereby, it is possible to reduce the dark current.

In addition, since other processes are the same as those of the first embodiment described above, the description of them is omitted.

Consequently, the photo detector (quantum dot infrared detector) according to the present embodiment, like the first embodiment described above, has the advantage that it is possible to easily reduce the dark current, hence to improve the performance of the photo detector.

Particularly, in the present embodiment, since the p-type impurity is respectively doped in the GaAs layers (the first semiconductor layer 5, the second semiconductor layer 3B) each of which is the closest to either n-type GaAs contact layers 4A, 4B, there are the advantages that the electric field across all regions becomes even, and the peak sense is improved (it is possible to detect only the infrared lights of the wavelength desirous of detecting). Further, in the photo detector changing polarity when the photo detector is made to operate, (for example, the double-wavelength infrared detector which can detect two wavelengths by changing bias), there is also an advantage that it is possible to reduce the dark current for each of the polarities.

In addition, in the embodiment described above, the p-type impurity with the same concentration is doped in the GaAs layers (the first semiconductor layer 5, the second semiconductor layer 3B) each of which is the closest to either n-type GaAs contact layers 4A, 4B; however, the concentration of the p-type impurity may be changed for each of the upper contact layer 4B and the lower contact layer 4A.

Third Embodiment

Next, a photo detector according to a third embodiment of the present invention will be described referring to FIGS. 10 to 12.

The photo detector (quantum dot infrared detector) according to the present embodiment, against the first embodiment described above, a contact layer is different, and a conductive type of impurity doped in the GaAs layer (the first semiconductor layer) and the quantum dots is the reverse. That is, in the configuration of the present embodiment, the n-type contact layer, n-type impurity (Si), p-type impurity (Be), and AuGe/Ni/Au electrode of the first embodiment described above are replaced with a p-type contact layer, p-type impurity (Be), n-type impurity (Si), and AuZn electrode respectively.

Figure 10:
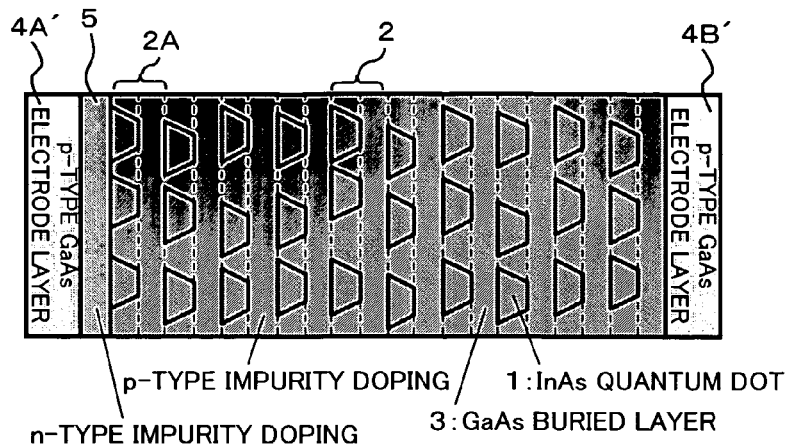
FIG. 10 is a schematic cross-sectional view showing a structure of a photo detector (quantum dot infrared detector) according to a third embodiment of the present invention.

Specifically, the quantum dot infrared detector of the present embodiment, as shown in FIG. 10 for example, has a plurality of quantum dot layers 2 including InAs quantum dots 1, and p-type GaAs contact layers (first conductive type contact layers) 4A', 4B' being provided at the opposite sides so as to sandwich the plurality of quantum dot layers 2. In addition, in FIG. 10, the same compositions as those of the first embodiment described above (refer to FIG. 1) are attached the same numerals.

Here, the quantum dot layer 2 is configured by burying the InAs quantum dots 1 with GaAs buried layer 3. Additionally, the quantum dot layer 2 is not limited to this, for example, it may be configured by forming a GaAs intermediate layer on an InGaAs cap layer or an InAlAs cap layer which covers the InAs quantum dots 1. Thereby, it is possible to render response wavelength of the quantum dot infrared detector long or short.

Then, in the present embodiment, as shown in FIG. 10, n-type impurity (a second conductive type impurity) is doped in a region between the one p-type GaAs contact layer 4A' (herein, a p-type GaAs contact layer becoming high potential when a potential difference (bias) is applied) and a quantum dot layer (a first quantum dot layer) 2A which is the closest to this p-type GaAs contact layer 4A' of high potential, in other words, the n-type impurity is doped in a GaAs layer (a first semiconductor layer) 5 formed in this region.

In this way, the n-type impurity is doped without changing the material and composition of the buried layer burying the quantum dots 1, so that the barrier against the holes (carriers) positioned at the p-type GaAs contact layer 4A' of high potential is formed between the p-type GaAs contact layer 4A' of high potential and the first quantum dot layer 2A, thereby the dark current can be reduced.

By the way, in the present embodiment, since the p-type GaAs contact layers 4A', 4B' are used, the quantum structure of the valence band is used for detecting infrared lights. That is, in the quantum dot infrared detector according to the present embodiment, when infrared lights are made incident, the holes positioned at the ground state formed within the quantum dots of the valence band are excited, and result in photo current flowing toward the p-type GaAs contact layer 4B', so that the infrared lights can be detected by detecting the current.

Figure 11:
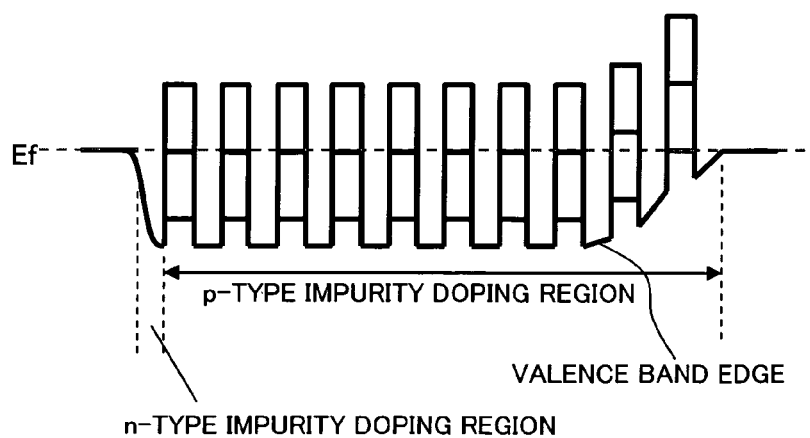
FIG. 11 is a diagram showing a valence band edge profile of a photo detector (quantum dot infrared detector) with being doped p-type impurity and n-type impurity according to the third embodiment of the present invention.

Here, FIG. 11 shows the valence band profile in the case that the n-type impurity and p-type impurity are doped.

As shown in FIG. 11, when the n-type impurity is doped in the GaAs layer (the first semiconductor layer) 5 formed between the one p-type GaAs contact layer 4A' and the first quantum dot layer 2A which is closest to this one p-type GaAs contact layer 4A', the energy level of the valence band edge of the GaAs layer 5 in which the n-type impurity is doped decreases more than a case that no n-type impurity is doped (in the case of the i-n junction), according to the principle of the p-n junction.

In this case, When no n-type impurity is doped in the GaAs layer 5, in the first quantum dot layer 2A being the closest to the one p-type GaAs contact layer 4A', the Fermi level reaches the excited state of the quantum dots 1; when the p-type impurity is doped in the GaAs layer 5, as shown in FIG. 11, it increases to the ground state of the quantum dots 1.

Further, like the first embodiment described above, as shown in FIG. 10, the p-type impurity (the first conductive type impurity) is doped in the region (here, the quantum dots 1 formed in this region) between the GaAs layer (the first semiconductor layer) 5 and the other p-type GaAs contact layer 4B' (here, p-type GaAs contact layer resulting in low potential when the potential difference is applied).

In this case, if approximately making the number of the impurity agree with that of the quantum dots, one hole is approximately applied to the ground state of the quantum dots 1, as shown in FIG. 11, the Fermi level is equal to the ground state of the quantum dots 1. Thereby, it is possible to prevent from decreasing of the number of the holes positioned at the ground state of the quantum dots 1, hence it is possible to prevent the amount of the photo current from decreasing.

Figure 12:
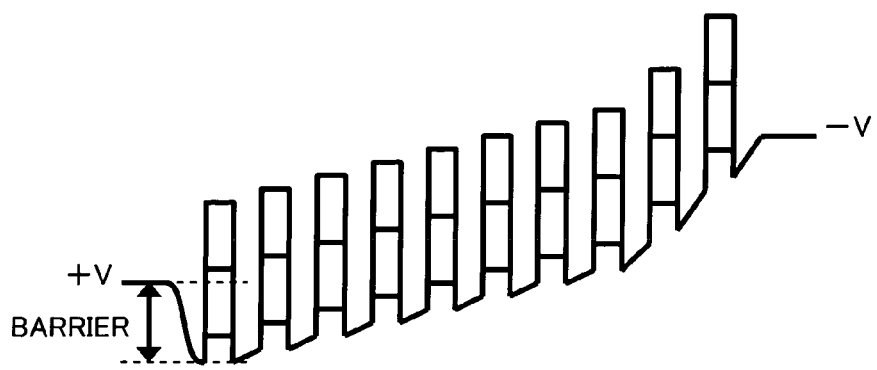
FIG. 12 is a diagram showing a valence band edge profile of a photo detector (quantum dot infrared detector) with being applied a potential difference according to the third embodiment of the present invention.

Here, FIG. 12 shows the valence band profile when the potential difference is applied between the p-type GaAs layers 4A' and 4B'.

As described above, when the n-type impurity is doped in the GaAs layer 5 formed between the one p-type GaAs contact layer 4A' and the first quantum dot layer 2A which is the closest to this one p-type GaAs contact layer 4A', as shown in FIG. 12, when the potential difference is applied, the energy level of the valence band edge of the GaAs layer 5 which is the closest to the p-type GaAs contact layer 4A' of high potential becomes lowest, it results in the barrier against the holes (carriers) positioned at the p-type GaAs contact layer 4A' of high potential.

That is, with doping the n-type impurity in the GaAs layer 5 being the closest to the p-type GaAs contact layer 4A', the energy level of the valence band edge of the GaAs layer 5 being the closest to the p-type GaAs contact layer 4A' can be made to decrease to the same degree level to the energy level of the valence band edge of the i-type GaAs buried layer which is a few layers distance from the contact layer of high potential of the conventional structure in a state where the potential difference is not applied. When the potential difference is applied to this, the energy level of the valence band edge of the GaAs layer 5 which is the closest to the p-type GaAs contact layer 4A' of high potential becomes lowest, it results in the barrier.

This barrier is more spatially approached toward the n-type GaAs contact layer 4A' of high potential than the lowest portion of the energy level of the conventional structure in which the n-type impurity is not doped. Consequently, the height of the barrier becomes higher than the lowest portion of the energy level of the conventional structure. Thereby, it is possible to reduce the dark current without changing the material and composition of the GaAs buried layer.

In addition, since other configurations are the same as those of the first embodiment described above, the description is omitted.

Further, the method for manufacturing the photo detector (quantum dot infrared detector) according to the present embodiment will be achieved, if, in the method for manufacturing the photo detector in the first embodiment described above, the p-type GaAs contact layer is used instead of the n-type GaAs contact layer, the process of doping the p-type impurity is carried out instead of the process of doping the n-type impurity, and the process of doping the n-type impurity is carried out instead of the process of doping the p-type impurity; a method for manufacturing the photo detector (is fundamentally similar to that according to the first embodiment, so that the description is omitted.

Consequently, according to the photo detector (quantum dot infrared detector) concerning the present embodiment, like the first embodiment described above, there is the advantage that it is possible to easily reduce the dark current, hence to improve the performance of the photo detector, with only doping the n-type impurity in the GaAs layer (the first semiconductor layer) 5 which is closest to the one p-type GaAs contact layer 4A'.

In addition, in the present embodiment, there is described that this embodiment is the modification example of the first embodiment described above; however, it is not limited to this, the present embodiment may be configured as the modification example of the second embodiment described above.

That is, in addition to the configuration of the present embodiment described above, the n-type impurity (the second conductive type impurity) may be doped in the GaAs buried layer (the second semiconductor layer) formed between the other p-type GaAs contact layer 4B' and the quantum dots configuring the second quantum dot layer such that the barrier is formed between the other first conductive type contact layer (p-type GaAs contact layer 4B') and the quantum dot configuring the quantum dot layer (the second dot layer) which is closest to this first conductive type contact layer.

Thereby, like the second embodiment described above, the electric field across all regions becomes even, so that there is an advantage that the peak sensitivity is improved (it is possible to detect the infrared lights of the wavelength desirous of detecting). Further, in the photo detector changing polarity for causing the photo detector to operate (for example, the double-wavelength infrared detector which can detect two wavelengths by changing bias), it is an advantage that it becomes possible to reduce the dark current for each of the polarities.

Alternative Embodiments

By the way, the present invention is not limited to the configurations, methods, and conditions described in each embodiment above, various modifications can be realized without departing from the spirit of the present invention.

For example, in the respective embodiments described above, the material of the quantum dots is assumed to be the InAs; however, it is not limited to this, it may be e.g., InGaAs including a few amount of Ga.

Further, in the respective embodiments described above, the molecular beam epitaxial technique is used as the growth techniques; however, it is not limited to this, other techniques may be used such as metal-organic vapor phase epitaxial growth techniques (MOVPE techniques; metal organic chemical vapor deposition (MOCVD) techniques) or atomic layer epitaxial growth techniques (ALE techniques) for example.

Further, in the respective embodiments described above, the number of the quantum dot layers assumed to the tenth layers; the number of layers of the quantum dot layers is an arbitrary, it may be optionally selected within the order of a few layers to thirtieth layers.

What is claimed is:

1. A photo detector, comprising:
a plurality of quantum dot layers being stacked, each of the plurality of quantum dot layers including a plurality of quantum dots and a buried layer which buries the plurality of quantum dots, the buried layer being a first conductive type semiconductor layer; and
first conductive type contact layers provided to sandwich the plurality of quantum dot layers on opposite sides,
wherein a second conductive type impurity being different from a first conductive type impurity is doped in a first semiconductor layer formed between one of the first conductive type contact layers and a first quantum dot layer closest to the one of the first conductive type contact layers to form a barrier against carriers positioned in the one of the first conductive type contact layers;
the first semiconductor layer is formed of a material consisting of a single material composition;
the first semiconductor layer and the buried layer comprise the material and
one face of the first semiconductor layer is in contact with the first quantum dot layer closest to the one of the first conductive type contact layers, and another face of the first semiconductor layer is in contact with the one of the first conductive type contact layers.

2. The photo detector according to claim 1, wherein,
the one of the first conductive type contact layers is an n-type contact layer which becomes low potential when a potential difference is applied between the first conductive type contact layers;
the first quantum dot layer is a quantum dot layer closest to the n-type contact layer of the low potential;
the first semiconductor layer is formed between the n-type contact layer of the low potential and the first quantum dot layer;
the second conductive type impurity is a p-type impurity; and
the first conductive type impurity is an n-type impurity.

3. The photo detector according to claim 1, wherein,
the one of the first conductive type contact layers is a p-type contact layer which becomes high potential when a potential difference is applied between the first conductive type contact layers;
the first quantum dot layer is a quantum dot layer closest to the p-type contact layer of the high potential;
the first semiconductor layer is formed between the p-type contact layer of the high potential and the first quantum dot layer;
the second conductive type impurity is an n-type impurity; and
the first conductive type impurity is a p-type impurity.

4. The photo detector according to claim 1, wherein the second conductive type impurity is doped in a second semiconductor layer formed between the other of the first conductive type contact layers and quantum dots which are included in a second quantum dot layer closest to the other of the first conductive type contact layers to form a barrier against carriers positioned in the other of the first conductive type contact layers.

5. The photo detector according to claim 4, wherein the second semiconductor layer is a portion of a buried layer formed between the other of the first conductive type contact layers and the quantum dots which are included in the second quantum dot layer.

6. The photo detector according to claim 1, wherein,
at least one of the first conductive type contact layers is an n-type contact layer;
the second conductive type impurity is a p-type impurity; and
the first conductive type impurity is an n-type impurity.

7. The photo detector according to claim 1, wherein,
at least one of the first conductive type contact layers is a p-type contact layer;
the second conductive type impurity is an n-type impurity; and
the first conductive type impurity is a p-type impurity.

8. The photo detector according to claim 1, wherein the quantum dots comprise InAs; and the first conductive type contact layers comprise GaAs.

9. A photo detector comprising:
a plurality of quantum dot layers being stacked, each of the plurality of quantum dot layers including a plurality of quantum dots and a buried layer which buries the plurality of quantum dots, the buried layer being a first conductive type semiconductor layer; and
first conductive type contact layers provided to sandwich the plurality of quantum dot layers on opposite sides,
wherein a second conductive type impurity being different from a first conductive type impurity is doped in a first semiconductor layer formed between one of the first conductive type contact layers and a first quantum dot layer closest to the one of the first conductive type contact layers to form a barrier against carriers positioned in the one of the first conductive type contact layers;
the first semiconductor layer and the buried layer comprise a material having a same composition; and
the second conductive type impurity is doped in a second semiconductor layer formed between the other of the first conductive type contact layers and quantum dots which are included in a second quantum dot layer closest to the other of the first conductive type contact layers to form a barrier against carriers positioned in the other of the first conductive type contact layers.

10. The photo detector according to claim 9, wherein the second semiconductor layer is a portion of a buried layer formed between the other of the first conductive type contact layers and the quantum dots which are included in the second quantum dot layer.

* * * * *